United States Patent [19]

Aitken

[11] Patent Number: 4,587,432
[45] Date of Patent: May 6, 1986

[54] APPARATUS FOR ION IMPLANTATION

[75] Inventor: Derek Aitken, East Molesay, England

[73] Assignee: Applied Materials, Inc., Santa Clara, Calif.

[21] Appl. No.: 637,514

[22] Filed: Aug. 3, 1984

[51] Int. Cl.$^4$ .................... A21K 27/02; H01J 37/08
[52] U.S. Cl. ................................................ 250/492.2
[58] Field of Search ............... 250/281, 282, 283, 296, 250/492.2, 492.21, 396

[56] References Cited

U.S. PATENT DOCUMENTS 4,433,247 2/1984 Turner ..................... 250/492.21

OTHER PUBLICATIONS

"A Satellite-Borne Ion Mass Spectrometer for the Energy Range 0 to 16 Kev", Balsiger et al., *Space Sci. Ins.*, vol. 2, No. 4, pp. 499–521, Sep. 1976.

Primary Examiner—Bruce C. Anderson
Attorney, Agent, or Firm—Flehr, Hohbach, Test, Albritton, Herbert

[57] ABSTRACT

An ion implantation system in which surfaces of ion flight tube and drift tube perpendicular to ion dispersion plane have geometric configuration which precludes sputtering of contaminants onto path through resolving slit.

11 Claims, 15 Drawing Figures

APPARATUS FOR ION IMPLANTATION

This invention relates generally to systems for implanting ions of a preselected chemical element into a target element and, more specifically, to systems for implanting conductivity modifying chemical impurities into semiconductor wafers as part of the process for manufacturing semiconductor devices such as large-scale integrated circuit chips. This invention specifically involves configurations from ion flight tubes and ion drift tubes for ion implantation equipment which reduces contamination of the target element with unwanted ion species.

The principal commercial use of ion implantation systems today is in the manufacture of large-scale integrated circuit (LSIC) chips. Very great improvements in the scale of integration of semiconductor devices on integrated circuit (IC) chips and the speed of operation of such devices have been achieved over the past several years. These improvements have been made possible by a number of advances in integrated circuit manufacturing equipment as well as improvements in the materials and methods utilized in processing virgin semiconductor wafers into IC chips. The most dramatic advances in manufacturing equipment have been improved apparatus for lithography and etching of circuit patterns on the semiconductor wafer and improved systems for implanting ions of conductivity modifying impurities into the semiconductor wafer.

Generally, the density of integrated circuits and their speed of operation are dependent largely upon the accuracy and resolution of the lithography and etching apparatus used to form patterns of circuit elements in masking layers on the semiconductor wafer. However, density and speed are also dependent upon tight control of the profile of doped regions in the wafer, i.e. regions to which substantial concentrations of conductivity modifying impurities have been added. Tight control of water doping can best be achieved using ion implantation techniques and equipment. The uniformity of doping achievable only with ion implantation is critical in the fabrication of smaller geometry devices. In addition, doping uniformity across the wafer and repeatability of doping concentration from wafer to wafer, which is achievable with ion implantation, dramatically improves fabrication yields of high density devices.

Figure 1:
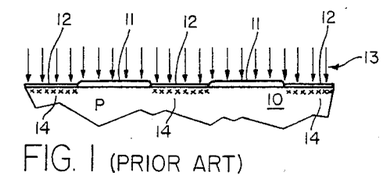
FIGS. 1-3 are fragmented section views of a portion of a semiconductor wafer illustrating the use of ion implantation in a semiconductor process.
Figure 2:
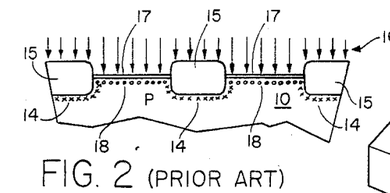
Figure 3:
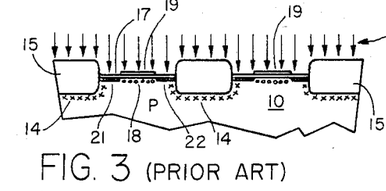

FIGS. 1-3 illustrate the use of a sequence of ion implantation steps in fabricating conductor-insulator-silicon integrated circuit devices on a semiconductor wafer. FIG. 1 illustrates a first ion implantation step which may be performed on the P-type wafer 10 to produce a light implant in the field regions 14 of the wafer. The field regions 14 are defined at this point as the regions of the wafer which are not covered by the regions of photoresist 11.

The regions of photoresist 11 are formed using a standard lithography process in which a thin layer of resist is formed over the entire surface of the wafer and then selectively exposed through a photomask pattern or by a directly scanned electron beam. This is followed by a developing step which removes areas of the photoresist which have been exposed to the light or to the electrons. This is known as a positive lithography process using a positive resist material, but it should be understood that a negative lithography process is also sometimes employed. After the layer of resist has been exposed and developed, a thin layer of thermal oxide 12 is typically grown over the exposed surfaces of the semiconductor wafer so that the implant in the field regions 14 will be made through the thin oxide layer.

A light implantation of ions of a P-type material such as boron is performed using ion implantation apparatus. This field implant is done to provide greater electrical isolation between the active device regions which lie under the regions 11 of photoresist material.

After the implantation steps shown in FIG. 1, wafer 10 is typically placed in a furnace and thick field oxide regions 15 are grown in a wet oxidation process. During this oxidation process, the implanted ions 14 are driven into the semiconductor substrate to underlie the field oxide regions 15.

After this step, the masking regions 11 are removed and a thin gate oxide 17 is formed in the active device regions 18. At this point, a second ion implantation step, using an N-type dopant material such as phosphorous may be performed to tailor the threshold voltage of the silicon gate field effect transistor devices to be formed in the active regions. Accordingly, N-type dopant ion 16 will be implanted through the gate oxide layer 17 in a light implant step to create the implanted region 18.

After this light threshold setting implant has been performed, the silicon gate regions 19 of the field effect transistor devices are formed on the wafer using a lithography and etching step to produce the device topology shown in FIG. 3. Thereafter, a heavy implantation of N-type ions may be performed to simultaneously dope the silicon gate element 19 and the source and drain regions 21 and 22 to complete the basic structure of the silicon gate field effect transistor device.

Many additional fabrication steps are required to complete the integrated circuit, including forming an oxide or nitride insulating layer over the entire wafer, forming contact openings to the source, drain and silicon gate regions with a lithography and etching process, followed by forming pathways of conductive material to provide a conductor network for connecting the various devices on the wafer into an overall integrated circuit.

From the above brief explanation, it should be apparent that there are a number of individual process steps which are performed on a semiconductor wafer to change the virgin wafer into a completed semiconductor IC device. Each of the individual process steps is a potential yield loss operation in that, if the step is not performed properly, all or a large portion of the IC devices on an individual wafer, or batch of wafers in a batch processing operation, may be defective. With process steps such as ion implantation, uniformity of dosage of the ion implant across the surface of the wafer importantly determines the yield of good chips on each individual wafer. In any doping operation, contamination of the wafer with ions or particles of other chemical species than the desired dopant material may result in defective devices and reduce yields. Although ion implantation produces lower contamination than other doping techniques, further reduction in contamination levels produced during ion implantation is a desirable goal. With further refinements in LSIC processing and further increases in device density, it may become critical to reduce contamination of the wafers during ion implantation.

In a co-pending and commonly assigned Aitken patent application entitled "Apparatus and Methods for Ion Implantation", Ser. No. 523,463, filed Aug. 15, 1983, an improved, high current ion implantation system and method is described. The invention set forth in this co-pending application provides for high implantation currents to be achieved in a very compact arrangement of basic ion implantation system elements. This co-pending Aitken application discloses a new ion optics arrangement which permits the achievement of a compact, high current ion implantation system. It also discloses the use of multiple beam resolving slits for reducing contamination which results from using a single resolving slit for implantation of ions of different chemical species. However, there are other components in the ion beam line which are additional sources of contamination.

Figure 4:
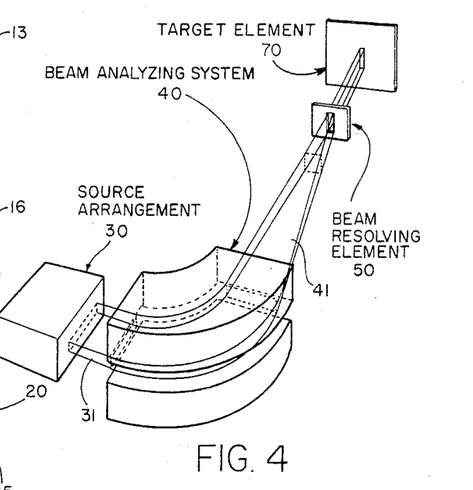
FIG. 4 is a generalized schematic isometric view of ion beam line components in an ion implantation system.

FIG. 4 illustrates the main components of the beam line of an ion implantation system of the type disclosed in the co-pending Aitken application. Source arrangement 30 produces a ribbon ion beam 31 which enters a beam analyzing system 40. The beam analyzing system 40 separates various ion species in the beam on the basis of mass to produce an analyzed ion beam 41 exiting the beam analyzing system 40. The beam resolving element 50 is disposed in the path of the analyzed beam 41 to permit a preselected ion species to pass to the target element 70.

Figure 7:
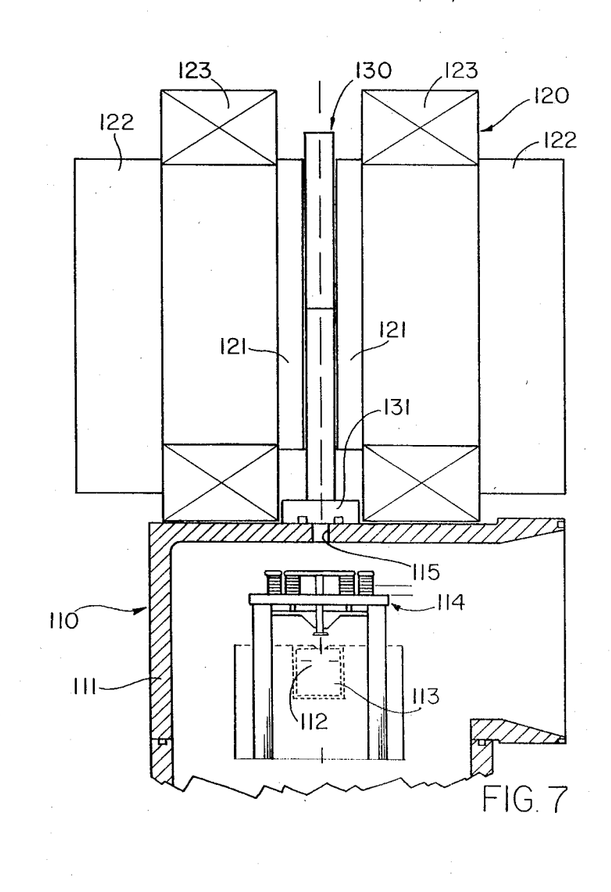
FIG. 7 is a side elevational view of an ion source and analyzing magnet arrangement which may incorporate the improved ion beam flight tube of this invention.
Figure 8:
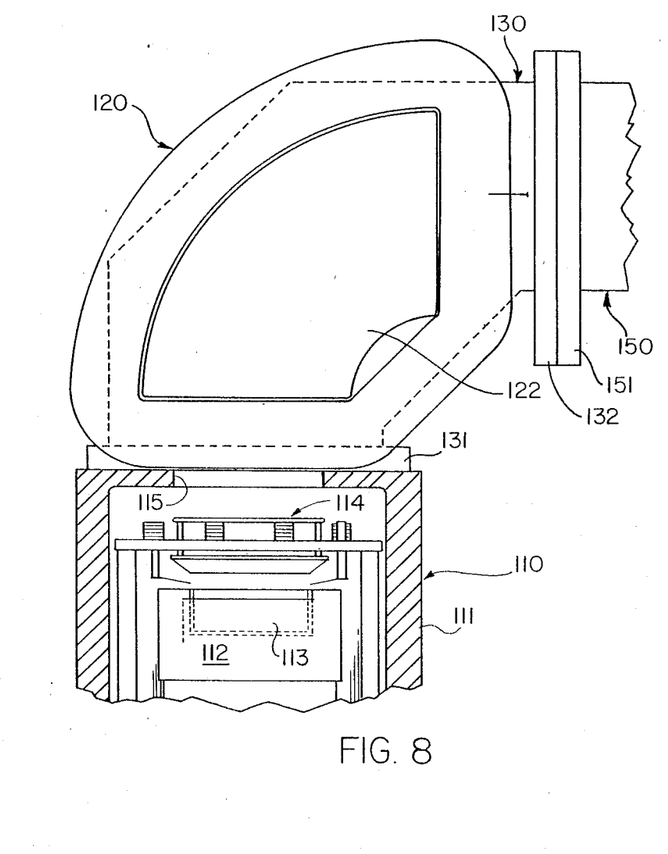
FIG. 8 is a front elevational view of an ion source and analyzing magnet arrangement which may utilize an ion beam flight tube in accordance with this invention.
Figures 9, 10:
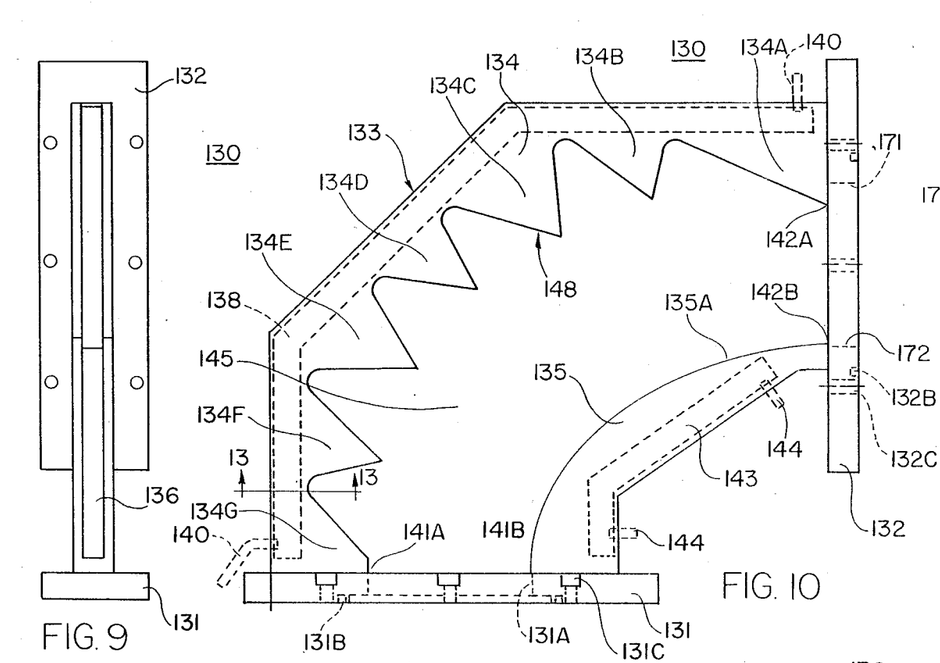
FIG. 9 is a back elevational view of a preferred embodiment of an ion beam flight tube in accordance with this invention.
FIG. 10 is a side elevational view of a preferred embodiment of an ion beam flight tube in accordance with this invention.
Figure 11:
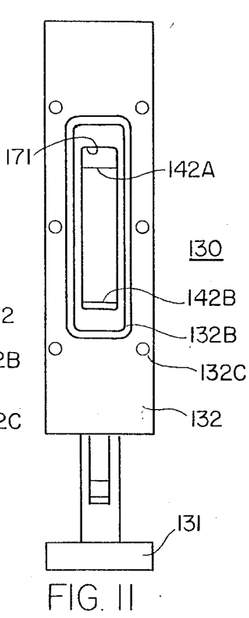
FIG. 11 is a front elevational view of a preferred embodiment of an ion beam flight tube in accordance with this invention.
Figure 12:
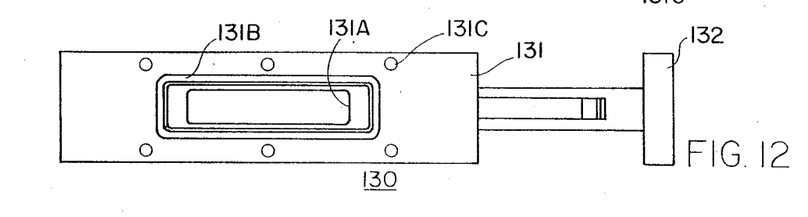
FIG. 12 is a bottom plan view of a preferred embodiment of an ion beam flight tube in accordance with this invention.

FIG. 4 shows the elements of the beam line in a schematic arrangement. In an actual ion implantation system, as shown in FIGS. 7 and 8, the entire beam pathway is typically confined within one or more vacuum-tight housings including an ion flight tube 130 positioned between the poles 121 of the magnets in the beam analyzing system, as well as a separate ion drift tube 150 for the beam exiting the beam analyzing system and directed toward the resolving slit in the beam resolving element. The interior walls of the ion flight tube and the ion drift tube may be a source of contaminating particles as deposits of unselected ions and neutral species build up thereon. Contamination may also occur from sputtering material from the walls themselves.

Figure 5:
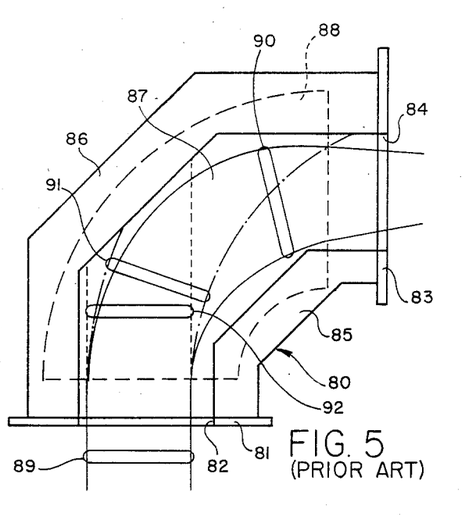
FIG. 5 is a schematic plan view of a prior art ion beam flight tube configuration.

FIG. 5 illustrates the geometry of a typical prior art ion flight tube positioned in the beam analyzing system of an ion implantation system. The ion flight tube 80 includes an entrance wall 81 having a beam entrance aperture 82 therein and a beam exit wall 83 having a beam exit port 84 therein. Inside wall 85 and outside wall 86 define an ion flight tube chamber 87 extending between the inlet port 82 and the outlet port 84. The pole faces of the analyzing magnet which forms a portion of the beam analyzing system are shown in dashed lines designated by the reference numeral 88. An ion beam 89 generated in an ion source upstream from the inlet aperture 82 contains ions of the preselected chemical species desired to be implanted into the target element as well as a variety of other ions and energetic neutral particles.

Based on the well-known principle of mass analysis using a magnetic field, the ions of the preselected chemical species are bent by the magnetic field of the beam analyzing system into a beam 90 which passes through the ion flight tube chamber 87 and the exit port 84 with ultimate focusing of the beam at the resolving slit of the beam resolving element. Ions of other chemical elements having different mass will be separated into different ion paths from those of the selected chemical species and will thus take different paths through the flight tube channel 87. For example, ions of a heavier mass would form a beam 91 which is separated from the beam 90 by the analyzing magnet with all of the ions striking the interior surfaces of the wall 86. In addition, the beam 89 will consist of some energetic neutral particles which will not be bent at all by the magnetic field of the beam analyzing magnet 88 and will thus form a beam 92 of energetic neutrals which also strike the inside of the flight tube chamber wall 86. The energetic neutrals in the beam 89 may consist of neutral particles of the selected species as well as neutral particles of the unselected chemical species.

The ions from beams of unselected ions such as beam 91 and from the beams of energetic neutral particles 92 will gradually build up a layer of chemical deposits on the interior walls of the flight tube. During subsequent operation of the ion implantation system, energetic neutrals or unselected ion species striking these interior walls where deposits exist will sputter contaminating particles from the walls. The sputtered particles may come off at any angle. Large areas of the walls of the flight tube chamber have a direct line of sight path through the exit port and the resolving slit into the target element. Thus the deposits on the interior walls of the ion flight tube represent a source of potential contamination for the wafers which are being implanted with the preselected chemical species.

As is well known, one of the most devastating contaminating ion species for IC's are sodium ions. Sodium compounds may be present in the ion source from human hands touching source components during maintenance of the ion source, such as during replacement of the ion source filament. In addition, sodium contamination may be present due to vaporized diffusion pump oil present in the evacuated beam line system. During source operation, sodium ions may be emitted from the source and build up as contamination on the walls of the flight tube and/or drift tube. During implantation of phosphorus or arsenic ions, the single mass phosphorus and arsenic ions will be selected by the beam analyzing system but the double mass ions may strike the outer wall of the ion flight tube and sputter contaminating particles therefrom. In prior art systems, these sputtered particles could have a line of sight flight direction of flight through the resolving slit of the system and thus a flight path into the target element.

Figure 6:
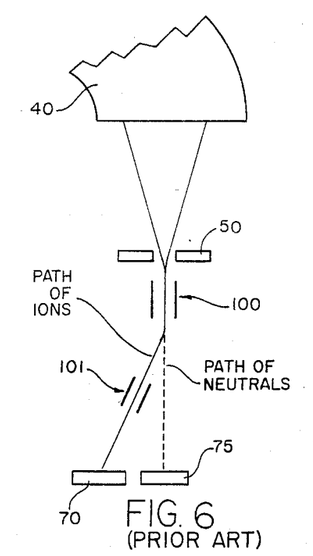
FIG. 6 is a schematic plan view of a prior art ion implantation system using a neutral trap arrangement to reduce contamination.

FIG. 6 illustrates a prior art neutral trap arrangement for reducing contamination of a target element by vaporized or sputtered particles from the ion flight tube. In the system of FIG. 6, a pair of electrostatic plates 100 diverts the ions passing through the resolving slit into a different beam path. The ions then pass through a second set of electrostatic plates 101 for scanning the beam across the target element 70. The path of neutral particles will not be affected by the electrostatic field between the plates 100. Thus neutral particles will continue on their path undiverted and strike a trap element 75. While this neutral trap approach is effective in certain low current ion implantation equipment, it is not a practicable solution for a high current implanter in which electrostatic deflection is preferably not employed. In addition, the neutral trap approach adds to the size of the overall ion implantation apparatus and thus would detract from the desired compactness of a high current implantation system.

Accordingly, it is the principal object of this invention to provide an ion implantation system with reduced contamination of the target element from beam line components.

In its broadest sense, this invention features a system for implanting ions into a target element which includes a source arrangement producing a beam of energetic ions of a plurality of chemical species, a beam analyzing arrangement which receives the generated beam and selectively separates various ion species in the beam on the basis of mass to produce an analyzed ion beam, and a beam resolving arrangement including a resolving slit disposed in the path of the analyzed beam for permitting ions of a preselected chemical species to pass to the target element. The beam analyzing means has a beam entrance port which communicates with the source arrangement. An evacuable chamber arrangement extends between the entrance port and resolving slit and is traversed by the ion beam. The chamber arrangement includes walls which have interior wall areas subject to being struck by unselected ions from the ion source. At least a portion of the interior wall areas are configured to comprise first and second groups of wall surface regions with the first group being disposed to face the resolving slit and oriented with respect to the beam entrance port such that all surface portions thereof have no direct line of sight to the ion source through the beam entrance port and are thus not subjected to bombardment by unselected ions. The second group of wall surface regions are disposed to face the beam entrance port and have surface portions subjected to being struck by unselected ions from the source. Such surface portions are oriented with no direct line of sight to the resolving slit for any matter which may be sputtered or evaporated from the surface portions.

In another aspect, this invention features a method for implanting ions of a selected species into a target element which involves the steps of producing an ion beam and directing the ion beam through an evacuable chamber toward a beam resolving element with a portion of the chamber communicating with a beam analyzing field to separate the ion beam into a selected ion beam component passing through the resolving slit and unselected ion beam components striking the walls of the evacuable chamber. The method further includes positioning within the evacuable chamber a plurality of wall surface regions at pre-arranged orientations such that wall portions thereof struck by the unselected ion components have no direct line of sight to the resolving slit.

This invention also features an improved configuration for an ion beam flight tube adapted to be positioned between opposed separated magnetic pole faces in a beam analyzing arrangement for an ion implantation system which also incorporates an ion source upstream from the beam analyzing arrangement and a beam resolving slit downstream from the beam analyzing arrangement. The improved beam flight tube comprises separated inner and outer walls having respective interior wall surfaces disposed generally perpendicular to the magnet pole faces of the ion beam analyzing arrangement. These interior wall surfaces define a flight tube chamber therebetween with the first end of each of the interior wall surfaces defining a beam entrance port facing the source means and a second end of each of the interior wall surfaces defining a beam exit port facing the resolving slit. The interior wall surface of the outer wall is configured to comprise first and second groups of wall surface regions. The first group of wall surface regions is disposed to face the beam exit port and is oriented with respect to the beam entrance port such that all surface portions thereof have no direct line of sight to the ion source through the beam entrance port and are thus not subjected to bombardment by components of the ion beam. The second group of wall surface regions are disposed to face the beam entrance port and have surface portions which are subjected to being struck by components of the beam; but such surface portions are oriented with respect to the beam exit port such that there is no direct line of sight to the resolving slit through the beam exit port for any matter which may be sputtered or evaporated from these surface portions.

Preferably both the inner and outer walls are formed from a block of material having substantial thickness in the plane parallel to the magnet pole faces. In the preferred embodiment, a coolant flow channel is formed in exterior sections of the inner and outer walls. The interior section of the outer wall preferably comprises a plurality of wedge-shaped regions extending inwardly of the flight tube chamber to form the first and second groups of wall surface regions.

Preferably the beam flight tube is a separate sealed unit with top and bottom walls disposed over the inner and outer walls to form a vacuum-tight flight tube chamber.

A beam flight tube in accordance with this invention substantially reduces the contamination of a target element such as a semiconductor wafer with particles of chemical species which are present on the walls of the ion flight tube. This result is achieved in a compact flight tube design which permits full benefit of the compact ion beam optics provided by the system and method disclosed in the above-referenced co-pending Aitken application. In addition, improvements in yields of semiconductor devices on wafers processed in equipment utilizing the beam flight tube of this invention will be realized.

Other objects, features and advantages of this invention will be apparent from a consideration of the detailed description set forth below in conjunction with the accompanying drawings.

FIGS. 7 and 8 illustrate the placement of an ion flight tube in a preferred version of an overall ion implantation system utilizing the ion optics and ion beam components disclosed in the above-referenced co-pending Aitken patent application. FIGS. 7 and 8 show a simplified version of the overall ion source arrangement shown in the co-pending Aitken application and reference to that application is made for details of the preferred embodiment. The ion implantation apparatus includes an ion source arrangement 110 including an overall ion source housing 111 and an ion source module 112 therein. Ion source module 112 includes ion source chamber 113, together with all of the peripheral electrical biasing and gas supply arrangements therefor. An ion extraction electrode assembly 114 extracts a beam of ions from the ion source 113 to be directed through the exit port 115 into the corresponding entrance port (not shown) of the ion beam flight tube 130.

The ion beam flight tube 130 is sandwiched between the pole faces 121 of the analyzing magnet arrangement 120. The analyzing magnet arrangement 120 further includes a magnet yoke assembly 122 and electromagnet coils 123 wound thereon. The ion beam flight tube 130 includes a first mounting flange 131 for mounting the ion flight tube 130 to the ion source arrangement 110 in a vacuum-sealed relation utilizing known fastening and sealing technology. The ion flight tube arrangement 130 further includes a flange 132 to mount the ion flight tube in vacuum-sealed relation to a flange 151 on a drift tube arrangement 150. The drift tube 150 includes, at its downstream end, the beam resolving element including a resolving slit such as is shown schematically in FIG. 4.

FIGS. 9-13 show a preferred ion beam flight tube arrangement in accordance with this invention. Ion beam flight tube arrangement 130 includes entrance port mounting flange 131 and exit port mounting flange 132 for the mounting purposes described above in connection with FIGS. 7 and 8. The mounting flange 131 includes a beam inlet port 131A for admitting an ion beam from the ion source to the flight tube chamber 145. Grooved recess 131B is adapted to receive a sealing gasket for vacuum-sealing of the flange 131 to an ion source chamber as shown in FIG. 7. A plurality of mounting bolt apertures 131C, together with appropriate bolt fasteners may be utilized for this purpose.

Exit mounting flange 132 includes a beam outlet port 132A through which the selected ion beam passes to be admitted into the ion drift tube to which the flange 132 is mounted. Gasket recess 132B is adapted to receive a gasket for vacuum-sealing the flange 132 against a corresponding mounting flange on the drift tube. A plurality of mounting apertures 132C are provided for receiving a mounting bolts.

Figure 13:
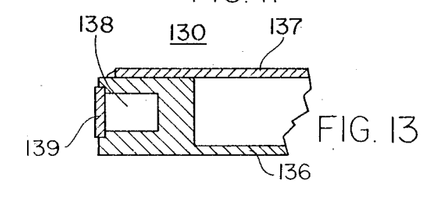
FIG. 13 is an enlarged section view of a portion of an ion beam flight tube in accordance with this invention taken along the lines 13—13 in FIG. 10.

The main body 133 of the ion flight tube arrangement 130 comprises an outer wall 134, an inner wall 135, a lower wall 136 and an upper wall 137, with the upper and lower walls 136 and 137 being particularly shown in FIG. 13. These four walls of the ion flight tube body 133 define the interior flight tube chamber 145. A first end of the outside wall 134 and the inside wall 135 define the beam entrance port to the flight tube chamber 145, the side extremities of which are designated 141A, 141B. Similarly, at the other end of the outer wall 134 and the inner wall 135, an ion exit port designated 142A, 142B, is defined. It should be understood that the use of the terms "inner", "outer", and "upper" are for convenience of description only and that the analyzing magnet arrangement and the ion flight tube may be positioned in any orientation.

The exterior section of the outer wall 134 has a coolant channel 138 formed therein. As shown in FIG. 13A a cover 139 is mounted over the channel 138 to provide a sealed coolant channel with inlet and exit tubes 140 provided to communicate the cooling fluid to and from channel 138. Similarly, an exterior section of the inner wall 135 has a coolant channel 143 formed therein with inlet and outlet tubes 144 provided to communicate coolant fluid thereto.

The inner section of the outer wall 134 is shaped in the form of a series of wedge sections 134A-134G. These wedge-shaped wall regions form an interior wall surface configuration for the outer wall which is at the heart of the contamination reduction feature of this invention and will be discussed in detail below in connection with FIG. 14. The interior section of the inner wall 135 includes an angled region 135A which together forms an interior wall configuration for the inner wall which precluded any line of sight to the resolving slit.

Figure 14:
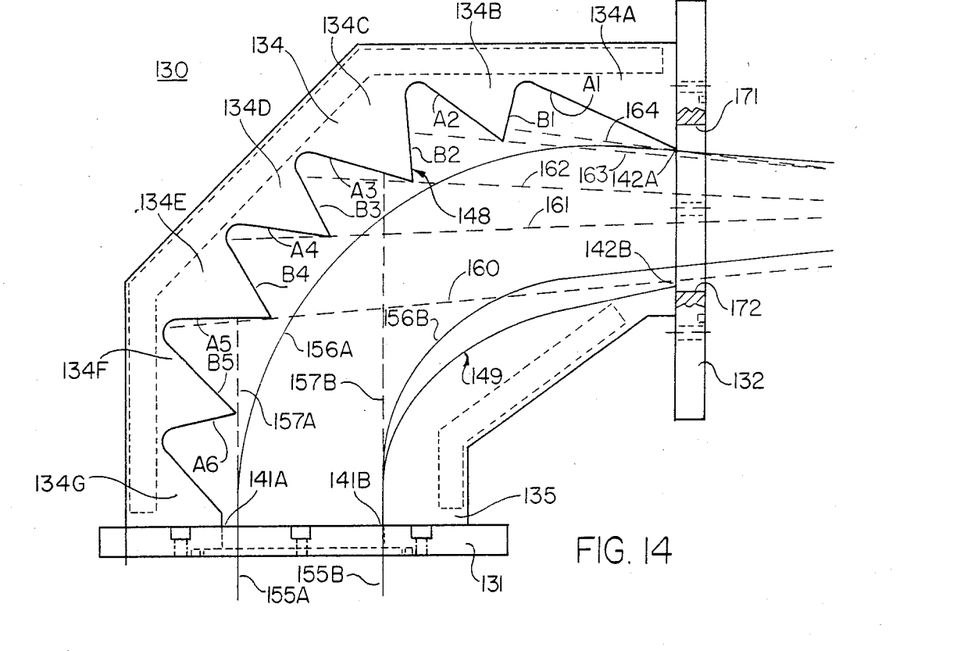
FIG. 14 is a side elevational view of an ion beam flight tube configuration in accordance with this invention and illustrating the operational contamination reduction features of the invention.

FIG. 14 illustrates the functional purpose of the design of the interior wall surface 148 of the outer wall 134. The ion beam entering the ion flight tube 130 is designated by the beam boundaries 155A-155B. This beam enters the beam entrance port defined by the ends 141A and 141B of the interior wall surfaces 148 and 149. The entering beam typically comprises ions of various chemical species including the desired chemical species to be passed through the resolving slit into the target element. This selected ion species follows a beam path designated by the boundary lines 156A, 156B. The analyzing magnet poles bend and focus the beam of selected ions into the aperture of the resolving slit which is downstream from the ion exit port defined by the ends 142A, 142B of the interior wall surfaces 148 and 149.

Ions of a different chemical species and different mass, that is unselected ions, will travel on ion flight paths through the flight tube 130 which will cause the ions to strike the interior walls of either the ion flight tube 130 or the ion drift tube (i.e. ion drift tube 150) as shown in FIG. 8. Ions which are close in mass value to the selected species will in part escape the exit port 142A, 142B and strike an interior wall surface of the ion drift tube. Beams of ions which are substantially lighter in mass than the selected ions will be bent more strongly by the analyzing magnet and strike the interior wall surface 149. Beams of ions of substantially greater mass than the selected ion species will be bent only slightly and strike the interior wall surface 148.

The entering beam 155A, 155B will typically also include energetic neutral particles which may be of the selected chemical species or an unselected chemical species. These energetic neutral particles will travel on substantially straight paths within the beam outline designated 157A, 157B and strike portions of the interior wall surface 148. In addition, thermal radiation from the ion source may enter the entrance port 141A, 141B and strike portions of the interior wall surface 148.

As shown in FIG. 14, the wedge-shaped wall sections 134A-134G form the interior wall surface 148 of the outer wall 134 into a first group of wall surface regions A1-A6 and a second group of wall surface regions B1-B5. The group B1-B5 each have their respective surface portions facing the beam exit port 142A, 142B and are oriented with respect to the beam entrance port 141A, 141B such that all surface portions of these wall surface regions in the B1-B5 group have no direct line of sight to the ion source through the beam entrance port. Furthermore, because of the orientation of these wall surface groups, no portion of the wall surface regions are subjected to bombardment by unselected ions or neutral particles.

It is seen in FIG. 14 that portions of the wall surface regions B1-B4 have a direct line of sight through the resolving slit in the ion drift tube with a line of sight regions generally designated by the dashed lines 160, 161, 162 and 163. However, because the wall surface regions B1-B4 are not subjected to bombardment by ions or energetic neutrals, direct sputtering of contaminant particles off of such surfaces with possible direct line of sight paths through the resolving slit to contaminate the target element cannot occur. Furthermore, each of the wall surface regions B1-B5 is not subjected to heating by direct impact of ions or energetic neutrals or by infrared radiation from the ion source. While it is possible that the wall surface regions B1-B5 may become contaminated with particles which are sputtered or evaporated from the wall surfaces A1-A5 and because of their path end up being deposited on wall surface regions B1-B5. However, resputtering or evaporation of these particles will not occur because the wall surface regions B1-B5 are oriented such that they are shielded from direct impact of energetic ions and neutral particles.

The wall surface regions A1-A5 include portions which are subject to bombardment by unselected ions and energetic neutral particles, but these wall surface regions are oriented with respect to the exit port 142A, 142B such that no point on any of these wall surface regions has a direct line of sight path through the resolving slit. As can be seen in FIG. 14 all of the portions of wall surface region A1 lie outside of the line of sight 163. Similarly, all portions of the wall surface region A2 lie outside of the line of sight 163. All portions of the wall surface regions A3, A4 and A5, respectively, lie outside of the direct lines of sight 160, 161 and 162. Thus, although contaminating particles may be sputtered from the wall surface regions A1-A5, such sputtered particles cannot directly travel through the resolving slit to strike the target element.

As shown in FIG. 14, the wall surface 171 of the beam outlet port in the mounting flange 172 is recessed back behind the side of the exit port defined by the end wall portion 142A to preclude any exposure of the wall section 171 to contaminating ions which could later be sputtered off and have a line of sight to the resolving slit. In addition, the wall surface 172 is recessed behind the side of the outlet port defined by the end region 142B to preclude deposition and later sputtering of contaminants on that wall surface.

By configuring the interior wall surface regions of the ion flight tube in the manner discussed above, the sources of possible contaminating particles delivered through the resolving slit into the target element is substantially eliminated. In other words, the ion flight tube chamber is virtually eliminated as a source of potential contamination of the target element.

Figure 15:
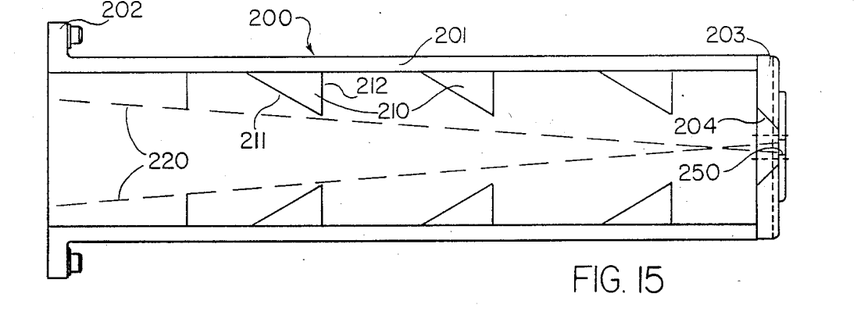
FIG. 15 is a top section view of an ion drift tube configuration in accordance with this invention.

As shown in FIG. 15, the general principles of this invention are also preferably applied in the ion drift tube attached to the exit port of the ion flight tube. As shown in FIG. 15, the ion drift tube 200 includes side walls 201 extending from a mounting flange 202 to an end wall 203. The resolving slit 250 is provided in a separate element adjacent end wall 203. The shaped exit aperture 204 in end wall 203 admits the ion beam to the resolving slit 250.

Within the interior of drift tube 200 a plurality of inner wall projections 210 are provided which extend around the entire inner periphery of the drift tube. Each of the wall projections 210 includes wall surface regions 211 which are subjected to being struck by unselected ions but which have no line of sight to resolving slit 250. Wall surface regions 212 have a line of sight to resolving slit 250 but are placed such that they will not be struck by unselected ions. It should be apparent that a number of interior wall configurations could be utilized to achieve this result.

The shape of the exit aperture 204 in end wall 203 is configured such that unselected ions striking the walls thereof will not have a line of sight through the resolving slit 250. This anti-contamination geometry of the ion drift tube will further reduce the possibility of contaminating ions to be sputtered off of interior surfaces of the drift tube and exit the resolving slit in the direction of the target element.

It should be understood that there are numerous specific interior wall configurations which could be implemented to achieve substantially the same result as that achieved with the FIG. 14 embodiment. Greater or fewer wedge-shaped regions in the inner section of the outer wall 134, but following the same overall pattern would implement the principles of this invention and achieve substantially the same result. In addition, it should be understood that the principles of the invention could be implemented using an outer wall section which does not comprise relatively thick wedge-shaped regions. A similar serpentine arrangement of thin wall regions would accomplish the same anti-contamination geometry. Cooling of such thinner wall regions could be accomplished, for example, by running coolant through separate tubes which are in heat contact relation with the exterior wall of the outer wall section.

It is preferable that the ion flight tube 130 be built as a modular unit with upper and lower walls which provide a complete vacuum seal with the inner and outer walls and the entrance port flange and exit port flange. However, it should be understood that other ion flight tube constructions could be employed such as, for example, flight tube constructions where the entire analyzing magnet assembly is formed in a vacuum enclosure and the inner and outer wall sections are separate components which define the ion flight tube chamber. The faces of the magnet poles themselves would form the upper and lower surfaces defining the flight tube chamber.

It should also be apparent that the principles of this invention can be applied to ion implantation apparatus utilizing any type of ion optics arrangement. While the invention is preferably applied to the ion implantation system disclosed in the above-referenced co-pending Aitken patent application, it could also be utilized in ion implantation systems which utilize the prior industry standard type of ion optics. The same beam analyzing principles apply in either case and the same contamination mechanisms are present in both cases. Thus, although a particular embodiment of this invention has been described above, it should be understood that numerous changes could be made therein without departing from the scope of the invention as claimed in the following claims.

What is claimed is:

1. In a system for implanting ions into a target element,
   source means producing a beam comprising energetic ions of a plurality of chemical species;
   beam analyzing means receiving said beam and selectively separating various ion species in said beam on the basis of mass to produce an analyzed ion beam; and
   beam resolving means including a resolving slit disposed in the path of said analyzed beam for permitting ions of a preselected chemical species to pass to said target element;
   said beam analyzing means comprising a pair of separated magnetic pole faces defining an ion dispersion plane; and a beam flight tube disposed in the region between said magnetic pole faces and comprising separated inner and outer walls having respective interior wall surfaces disposed generally perpendicular to said ion dispersion plane and defining a flight tube chamber therebetween with a first end of each of said interior wall surfaces defining a beam entrance port facing said source means and a second end of each of said interior wall surfaces defining a beam exit port facing said resolving slit, said interior wall surface of said outer wall comprising first and second groups of wall surface regions, said first group being disposed to face said beam exit port and oriented with respect to said beam entrance port such that all surface portions thereof have no direct line of sight to said ion source through said beam entrance port and are not subjected to bombardment by unselected ions, said second group being disposed to face said beam entrance port and having surface portions subjected to being struck by unselected ions from said source, said surface portions being oriented with no direct line of sight to said resolving slit through said beam exit port for any matter which may be sputtered or evaporated from said surface portions thereby preventing said matter from passing to said target element.

2. The system of claim 1, wherein said outer wall of said beam flight tube is formed from a block of material of substantial thickness, and a coolant flow channel is formed in an exterior section of said outer wall, and an interior section of said outer wall adjacent said coolant flow channel comprises a plurality of wedge-shaped regions extending inwardly to form said first and second groups of wall surface regions.

3. The system of claim 1, wherein said inner wall of said beam flight tube is formed from a block of material of substantial thickness, and a coolant flow channel is formed in an exterior section of said inner wall.

4. The system of claim 1, wherein said source means is disposed within an evacuable source housing and said resolving slit is disposed at a downstream end of an evacuable ion drift tube; said beam flight tube further comprises a first mounting flange mounted to said inner and outer walls at said beam entrance port for mounting said beam flight tube to said source chamber in vacuum sealing relation, and a second mounting flange mounted to said inner and outer walls at said beam exit port for mounting said beam flight tube to said ion drift tube in a vacuum-tight sealing arrangement, and top and bottom walls disposed over said inner and outer walls and forming with said inner and outer walls and said first and second flanges a vacuum-tight flight tube chamber, said second mounting flange having a beam outlet port with opposite wall surfaces disposed perpendicular to said ion dispersion plane being recessed behind said ends of said interior wall surfaces defining said beam exit port by a distance sufficient for said wall surfaces to be shielded from any beam components arriving at said beam exit port.

5. The system of claim 1, wherein said resolving slit is disposed at a downstream end of an ion drift tube mounted to said flight tube at said beam exit port thereof; said ion drift tube having interior wall surfaces extending the length of said drift tube, said interior wall surfaces comprising first and second groups of wall surface regions, said first group being disposed to face said resolving slit and being oriented with respect to said exit port of said flight tube such that all surface portions thereof have no direct line of sight to said exit port, said second group being disposed to face said exit port of said flight tube and having surface portions subject to being struck by unselected ions, said surface portions being oriented with no direct line of sight to said resolving slit for any matter which may be sputtered or evaporated from said surface portions.

6. An ion beam flight tube adapted to be positioned between separated magnetic pole faces in a beam analyzing arrangement for an ion implantation system which incorporates an ion source upstream from said beam analyzing arrangement and a beam resolving slit downstream from said beam analyzing arrangement, said beam flight tube comprising separated inner and outer walls having respective interior wall surfaces disposed generally perpendicular to said magnetic pole faces and separated upper and lower walls having respective interior wall surfaces disposed parallel to said magnetic pole faces; said interior wall surfaces defining a flight tube chamber therebetween with a first end of said interior wall surfaces defining a beam entrance port positioned to face said ion source and a second end of said internal wall surfaces defining a beam exit port positioned to face said beam resolving slit; said interior wall surface of said outer wall comprising first and second groups of wall surface regions, said first group being disposed to face said beam exit port and being oriented with respect to said beam entrance port such that all surface portions thereof have no direct line of sight to said ion source through said beam entrance port and thus being free of bombardment by components of a beam from said ion source, said second group being disposed to face said beam entrance port and having surface portions subjected to bombardment by components of said beam, said surface portions being oriented relative to said beam exit port such that they have no direct line of sight to said resolving slit for any matter which may be sputtered or evaporated from said surface portions by said beam components thereby preventing said matter from entering into an ion target region.

7. The beam flight tube of claim 6, wherein said outer wall is formed from a block of material of substantial thickness and a coolant flow channel is formed in an exterior section of said outer wall; an interior section of said outer wall comprising a plurality of wedge-shaped regions extending inwardly of said flight tube chamber and forming said first and second groups of wall surface regions.

8. The system of claim 6, wherein said inner wall of said beam flight tube is formed from a block of material of substantial thickness and a coolant flow channel is formed in an exterior section of said inner wall.

9. The beam flight tube of claim 6, further comprising a first mounting flange mounted to said flight tube walls at said beam entrance port for mounting said beam flight tube in vacuum-sealed relation to a source chamber housing said ion source and a second mounting flange mounted to said walls of said flight tube at said beam exit port and adapted for mounting said beam flight tube in vacuum-sealed relation to an ion drift tube incorporating said resolving slit, said second mounting flange having a beam outlet port with opposite wall surfaces perpendicular to said upper and lower walls of said flight tube being recessed behind said second ends of said interior wall surfaces defining said beam exit port a distance sufficient for said wall surfaces to be shielded from any beam components arriving at said beam outlet port.

10. In combination, an ion beam flight tube adapted to be positioned between separated magnetic pole faces in a beam analyzing arrangement for an ion implantation system and an ion drift tube mounted to said flight tube and having a beam resolving slit mounted in a downstream end thereof, said ion beam flight tube being adapted to be positioned downstream from an ion source in said ion implantation system, said beam flight tube comprising separated inner and outer walls having respective interior wall surfaces disposed generally perpendicular to said magnetic pole faces and separated upper and lower walls having respective interior wall surfaces disposed parallel to said magnetic pole faces; said interior wall surfaces defining a flight tube chamber therebetween with a first end of said interior wall surfaces defining a beam entrance port positioned to face said ion source and a second end of said internal wall surfaces defining a beam exit port positioned to face said beam resolving slit in said ion drift tube; said interior wall surface of said outer wall comprising first and second groups of wall surface regions, said first group being disposed to face said beam exit port and being oriented with respect to said beam entrance port such that all surface portions thereof have no direct light of sight to said ion source through said beam entrance port and thus being free of bombardment by components of a beam from said ion source, said second group being disposed to face said beam entrance port and having surface portions subjected to bombardment by components of said beam, said surface portions being oriented relative to said beam exit port such that they have no direct line of sight to said resolving slit for any matter which may be sputtered or evaporated from said surface portions by said beam components; said ion drift tube having interior wall surfaces extending the length of said drift tube, said interior wall surfaces comprising first and second groups of wall surface regions, said first group being disposed to face said resolving slit and being oriented with respect to said exit port of said flight tube such that all surface portions thereof have no direct line of sight to said exit port, said second group being disposed to face said exit port of said flight tube and having surface portions subject to being struck by unselected ions, said surface portions being oriented with no direct line of sight to said resolving slit for any matter which may be sputtered or evaporated from said surface portions thereby preventing said matter from entering into an ion target region.

11. In a system for implanting ions into a target element, source means producing a beam comprising energetic ions of a plurality of chemical species;

beam analyzing means receiving said beam and selectively separating various ion species in said beam on the basis of mass to produce an analyzed ion beam; and beam resolving means including a resolving slit disposed in the path of said analyzed beam for permitting ions of a preselected chemical species to pass to said target element;

said beam analyzing means having an inlet port communicating with said source means to receive said ion beam; evacuable chamber means extending between said inlet port and said resolving slit and being traversed by said ion beam; said chamber means including wall means having interior wall areas subject to being struck by unselected ions in said analyzed ion beam; at least a portion of said interior wall areas being configured to comprise first and second groups of wall surface regions, said first group being disposed generally to face said resolving slit and oriented with respect to said inlet port such that all surface portions thereof are not subjected to bombardment by unselected ions, said second group being disposed to face said beam entrance port and having surface portions subjected to being struck by unselected ions from said source, said surface portions being oriented with no direct line of sight to said resolving slit for any matter which may be sputtered or evaporated from said surface portions thereby preventing said matter from passing to said target element.

* * * * *

UNITED STATES PATENT AND TRADEMARK OFFICE
CERTIFICATE OF CORRECTION

PATENT NO. : 4,587,432
DATED : May 6, 1986
INVENTOR(S) : Aitken, Derek

It is certified that error appears in the above—identified patent and that said Letters Patent is hereby corrected as shown below:

IN THE SPECIFICATION:

Column 1, line 40, "water" should be "wafer"

Column 8, line 8, after "'outer'," and before "and", insert "'lower'"

Signed and Sealed this

Nineteenth Day of August 1986

[SEAL]

Attest:

Attesting Officer

DONALD J. QUIGG

Commissioner of Patents and Trademarks